(12) United States Patent
Lee

(10) Patent No.: US 8,357,993 B2
(45) Date of Patent: Jan. 22, 2013

(54) STRUCTURE IN A HIGH VOLTAGE PATH OF AN ULTRA-HIGH VOLTAGE DEVICE FOR PROVIDING ESD PROTECTION

(75) Inventor: Jian-Hsing Lee, Hinchu (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 13/091,264

(22) Filed: Apr. 21, 2011

(65) Prior Publication Data

US 2011/0260287 A1  Oct. 27, 2011

(30) Foreign Application Priority Data

Apr. 26, 2010 (TW) ................................. 99113056 A

(51) Int. Cl.
*H01L 23/52* (2006.01)
(52) U.S. Cl. ........ 257/529; 257/328; 257/341; 257/500; 257/E23.149; 360/323
(58) Field of Classification Search ........................ None
See application file for complete search history.

(56) References Cited

U.S. PATENT DOCUMENTS 7,923,811 B1 * 4/2011 Im et al. ......................... 257/529
2010/0187566 A1 * 7/2010 Jou et al. ....................... 257/137

\* cited by examiner

*Primary Examiner* — Tan N Tran
*Assistant Examiner* — Scott R Wilson
(74) *Attorney, Agent, or Firm* — Muncy, Geissler, Olds & Lowe, PLLC

(57) ABSTRACT

An ultra-high voltage device has a high voltage path established from a high voltage N-well through a first metal layer to a second metal layer, and a contact plug electrically connected between the high voltage N-well and the first metal layer. The contact plug has a distributed structure on a horizontal layout to improve the uniformity of the ultra-high voltage device such that the current in the high voltage path will be more uniform distributed so as to avoid the localized heat concentration caused by non-uniform current distribution that would damage the ultra-high voltage device. Multiple fuse apparatus are preferably connected to the first metal layer individually. Each the fuse apparatus includes a poly fuse to be burnt down when an over-load current flows therethrough.

3 Claims, 6 Drawing Sheets

STRUCTURE IN A HIGH VOLTAGE PATH OF AN ULTRA-HIGH VOLTAGE DEVICE FOR PROVIDING ESD PROTECTION

FIELD OF THE INVENTION

The present invention is related generally to ultra-high voltage devices and, more particularly, to a structure in a high voltage path of an ultra-high voltage device for providing electro-static discharge (ESD) protection.

BACKGROUND OF THE INVENTION

Ultra-high voltage devices only can use self-protection scheme since they are often huge dimension devices. ESD protection schemes, increasing the dimensions of some critical layouts, are not available for Ultra-high voltage devices since they are already huge dimension devices. Even the dimension of ultra-high voltage devices is very huge, they still cannot meet the minimum ESD requirement. The root cause is that the device is non-uniform triggering on to induce the current localized at a finite region. Typically, a conventional ultra-high voltage device has a vertical cross-sectional view as shown in FIG. 1, in which a P-substrate 10 has a P-epilayer 12 thereon, a P-well 14 and a high voltage N-well 16 are formed on the P-epilayer 12, the high voltage N-well 16 has an oxide 28 thereon, and a contact region 18 is formed by doping the surface of the high voltage N-well 16 through an opening not covered by the oxide 28, and is electrically connected to a high voltage electrode HV through a contact plug 20, a first metal layer 22, a via 26 and a second metal layer 24, which is the high voltage path of the ultra-high voltage device. The high voltage N-well 16 raises the breakdown voltage of the ultra-high voltage device, thereby allowing the device to support high voltage operation. In FIG. 2, the drawing in the upper part is a layout of the ultra-high voltage device shown in FIG. 1, the lower drawing is an enlarged view of the area 30 in the foregoing layout. The contact plug 20 has a stripe shape in the horizontal cross-section of the ultra-high voltage device, and the terminal 32 of the contact region 18 is often the non-uniform portion of the ultra-high voltage device. When there is a great current, such as an ESD current, flowing through the high voltage path, the current intends to concentrate around the terminal 32 and produce great heat, resulting in localized high temperature to melt down this portion of the ultra-high voltage device. Once any portion of the high voltage path is burnt down, the ultra-high voltage device will lose its high voltage withstanding capability and become no more usable.

To date, there has not been any ESD protection about the ultra-high voltage technology, typically referring to the voltage equal to or higher than 500V, and thus an ultra-high voltage device only can be protected by its structure itself.

SUMMARY OF THE INVENTION

An objective of the present invention is to provide a structure for providing ESD protection for ultra-high voltage devices.

According to the present invention, an ultra-high voltage device has a high voltage path established from a high voltage N-well through a first metal layer to a second metal layer, and a contact plug electrically connected between the high voltage N-well and the first metal layer. The contact plug has a distributed structure on a horizontal layout to improve the uniformity of the ultra-high voltage device such that the current in the high voltage path will be more uniform distributed so as to avoid the localized heat concentration caused by non-uniform current distribution, thereby reducing the possibility of damaging the ultra-high voltage device.

Preferably, multiple fuse apparatus are connected to the first metal layer individually, and each the fuse apparatus includes a poly fuse to be burnt down when an over-load current flows therethrough.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
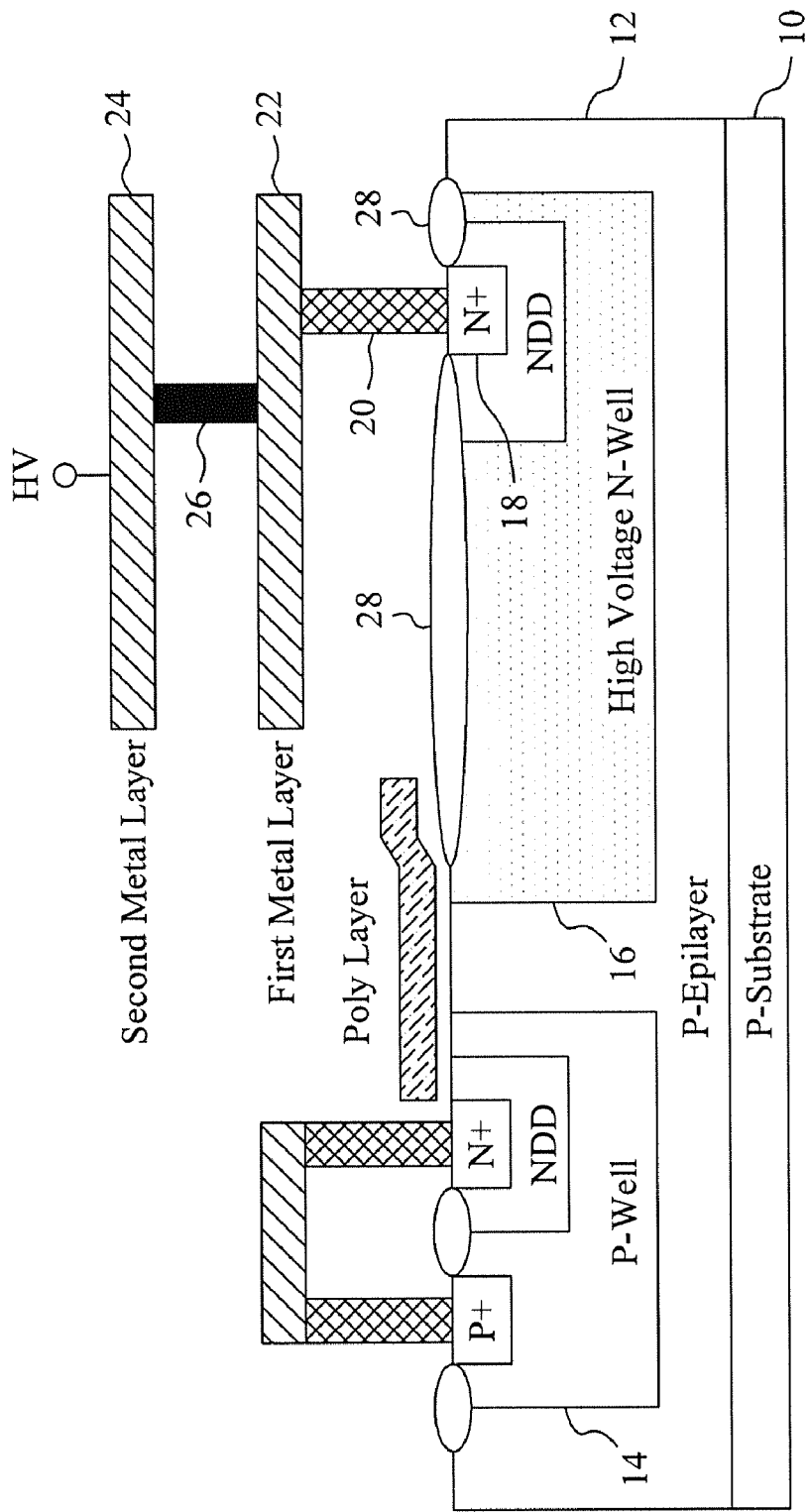
FIG. 1 is a vertical cross-sectional view of a conventional ultra-high voltage device.
Figure 2:
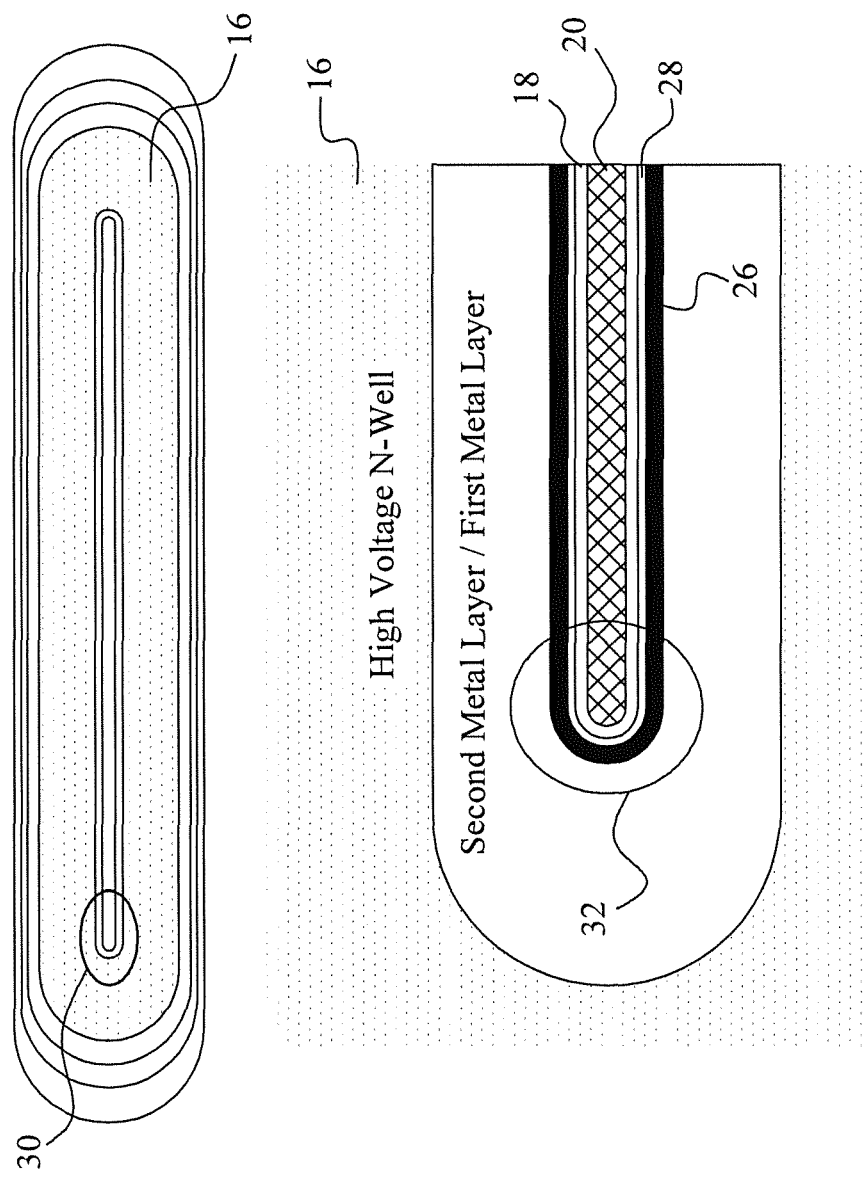
FIG. 2 is a horizontal layout of the ultra-high voltage device shown in FIG. 1.
Figure 3:
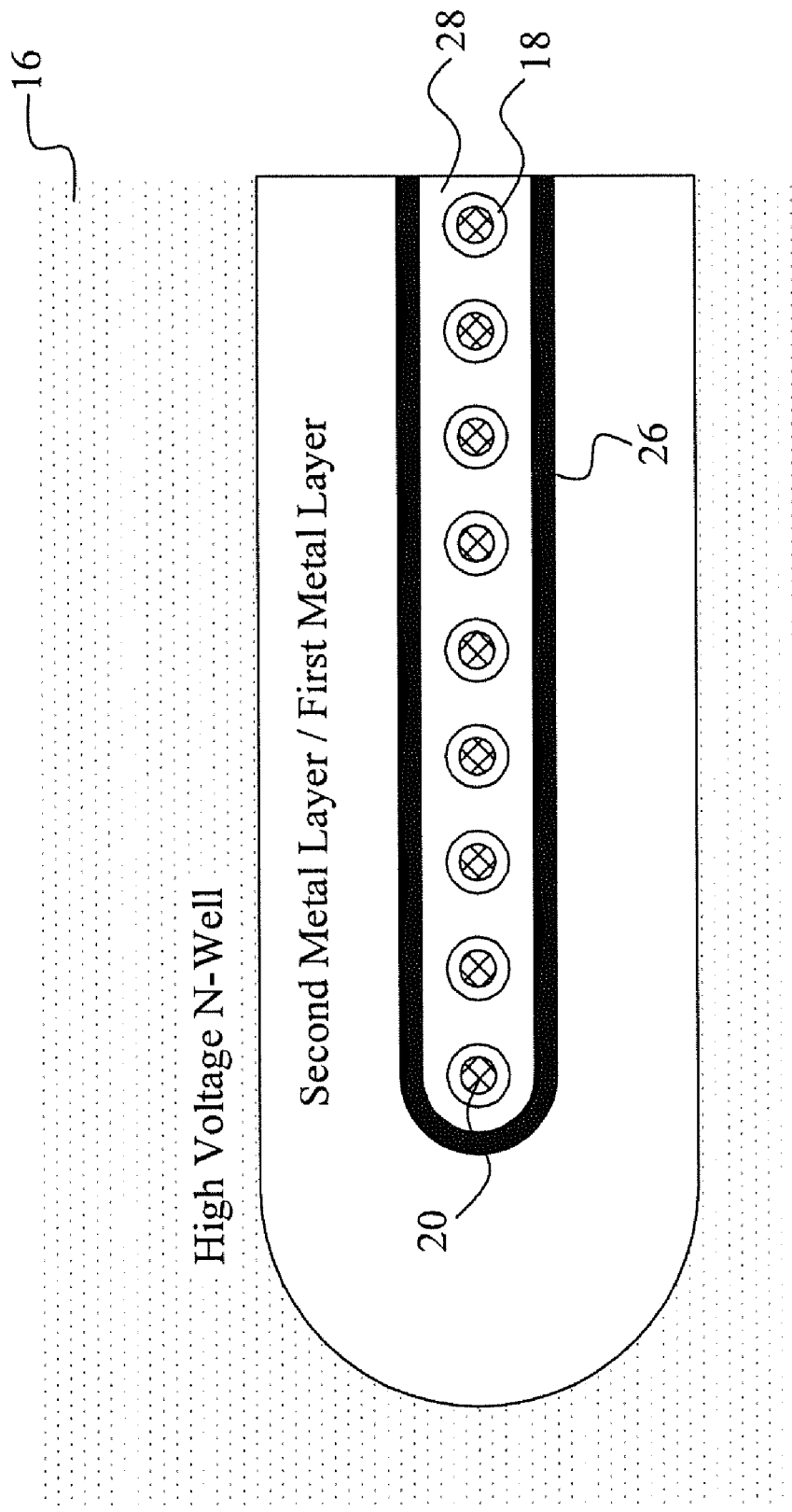
FIG. 3 is a horizontal layout of a first embodiment according to the present invention.

FIG. 3 shows a first embodiment according to the present invention, which has the same vertical cross-sectional view as that shown in FIG. 1, but has a distributed contact plug 20 with the contact region 18 conforming thereto, so that the horizontal layout has a dot-like distribution of discrete islands. This distributed structure helps to improve the uniformity of the ultra-high voltage device and thus allows the current in the high voltage path to be uniform distributed. Therefore, it may avoid the localized heat concentration caused by non-uniform current distribution when a great current, such as an ESD current, flowing the high voltage path, thereby reducing the possibility of damaging the ultra-high voltage device. In this embodiment, the discrete structure of the contact region 18 and the distributed contact plug 20 can be easily formed by changing the defined pattern without increasing manufacturing complexity, and will not increase the circuit size.

Figure 4:
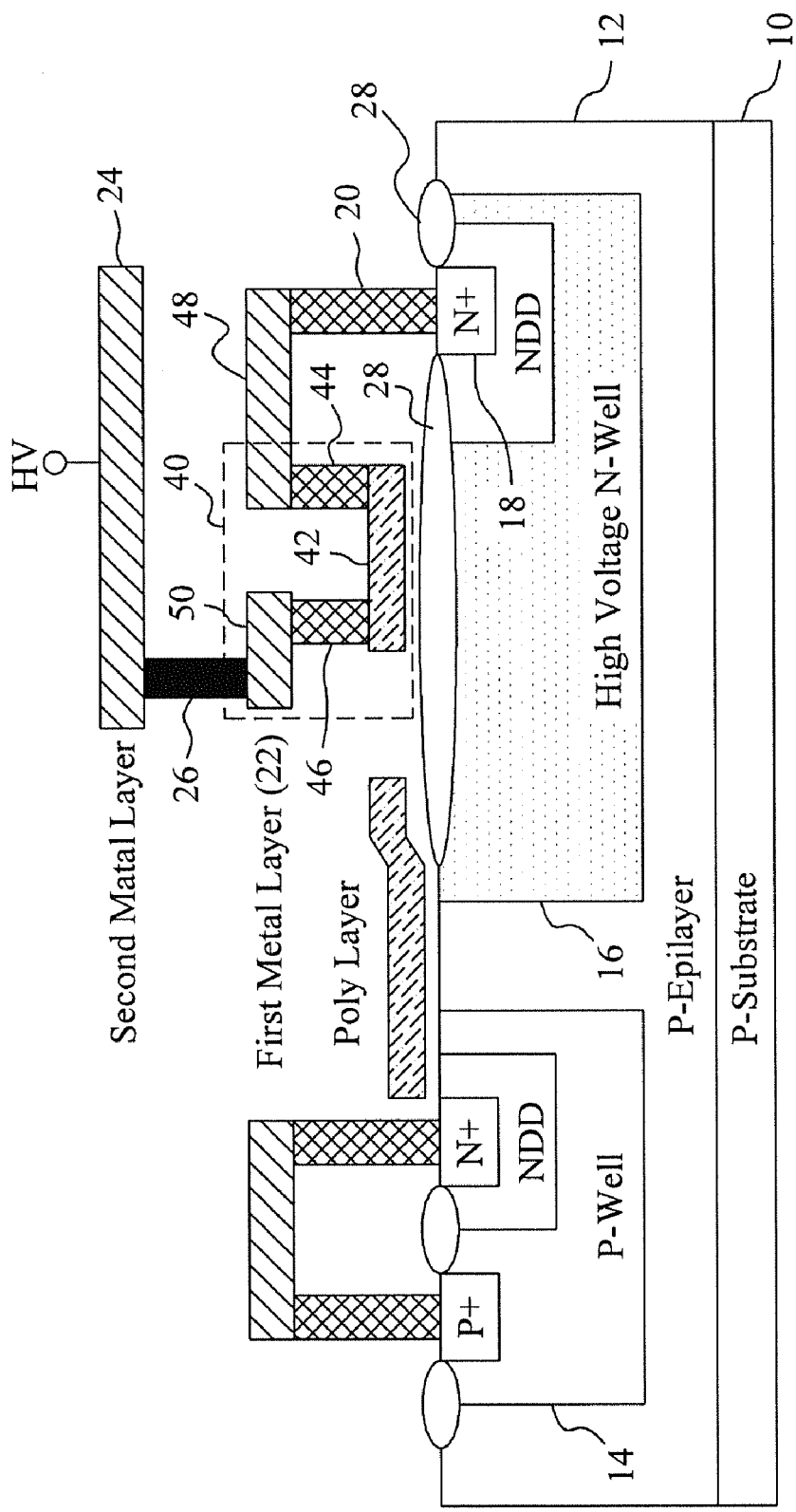
FIG. 4 is a vertical cross-sectional view of a second embodiment according to the present invention.
Figure 5:
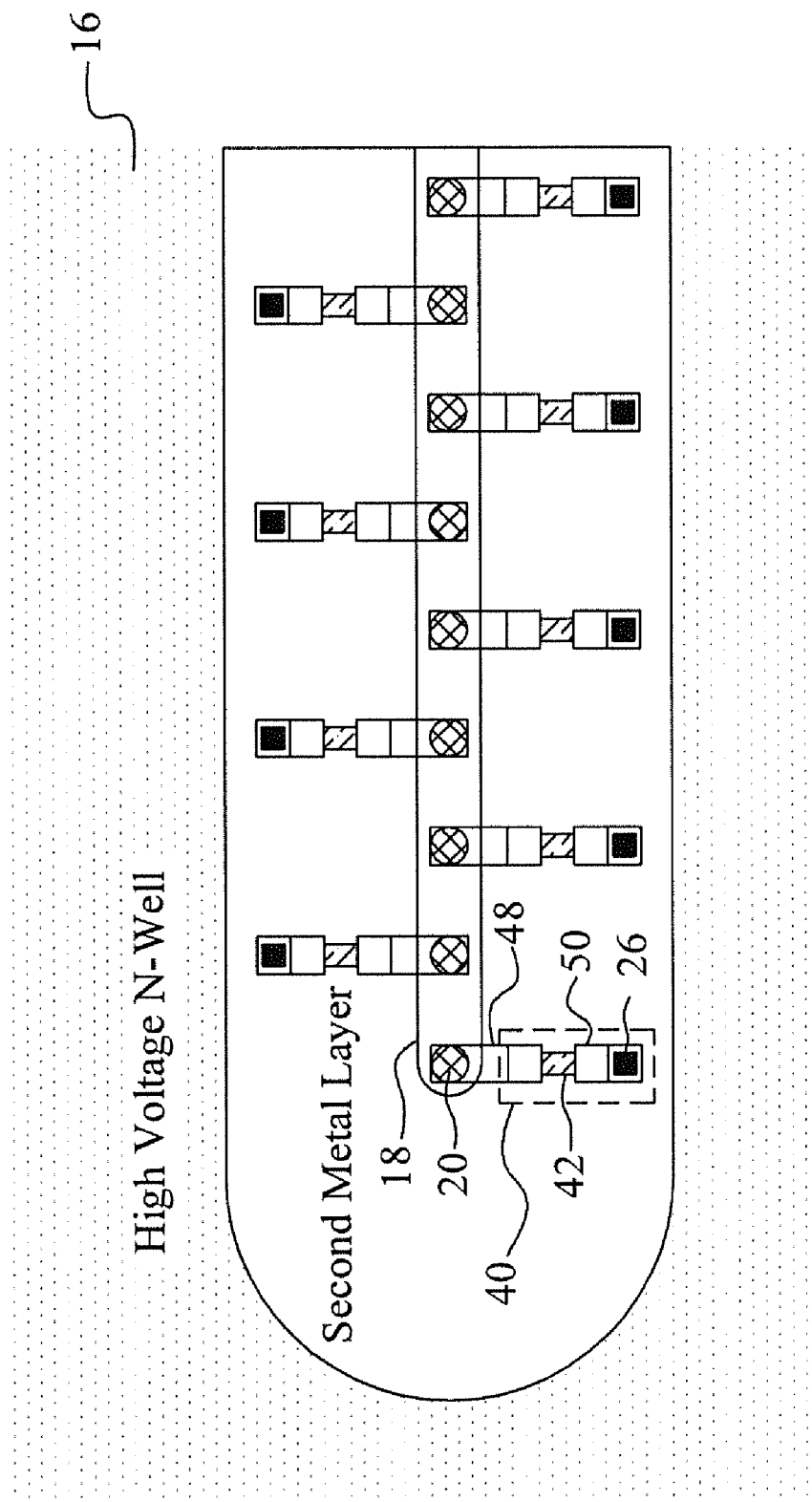
FIG. 5 is a horizontal layout of the second embodiment shown in FIG. 4.

FIG. 4 and FIG. 5 are a vertical cross-sectional view and a partial horizontal layout of a second embodiment, respectively. In addition to the contact plug 20 having a distributed structure on the horizontal layout, a plurality of fuse apparatus 40 are arranged on the high voltage path, each of which has a poly fuse 42 with its two ends connected to a first portion 48 and a second portion 50 of the first metal layer 22 through the connections 44 and 46, respectively. The first portion 48 and the second portion 50 are parts of the first metal layer 22 and are separate from each other. Since the second metal layer 24 is connected to each of the second portions 50 of the first metal layer 22 through a respective via 26, all the fuse apparatus 40 are connected in parallel between the contact region 18 and the second metal layer 24. The contact plug 20, the connections 44 and 46, the first metal layer 22 and the second metal layer 24 are all made of metal, so that when the device encounters an excessively great current, the poly fuse 42 of a proper length will be first broke before the contact plug 20, the connections 44 and 46, the first metal layer 22 and the second metal layer 24 are melted down. When the current flowing through any poly fuse 42 reaches the saturation current of this poly fuse 42, this poly fuse 42 will turn into a resistor of high impedance, and thus force the current to flow toward the other poly fuses 42 not saturated yet. As a result, for each saturated poly fuse 42, although the voltage may keep increasing, the current is prohibit from going up any more, and thereby the current will be uniform distributed over the poly fuses 42 of all the fuse apparatus 40. Even if the current on a poly fuse 42 exceeds its saturation current, this current will first break this poly fuse 42 and thus block the current from flowing to the contact region 18 of this poly fuse 42, thereby preventing the contact region 18 from being damaged to cause short circuit, and the other good poly fuses 42 will remain supportive to the ultra-high voltage device's normal operation. The poly fuses 42 may be provided by a polysilicon layer and the connections 44 and 46 may be formed together with the contact plug 20. Therefore, the structure of this embodiment requires no extra processing step. The fuse apparatus 40 may be arranged above the oxide 28, and thus will not enlarge the circuit layout.

Figure 6:
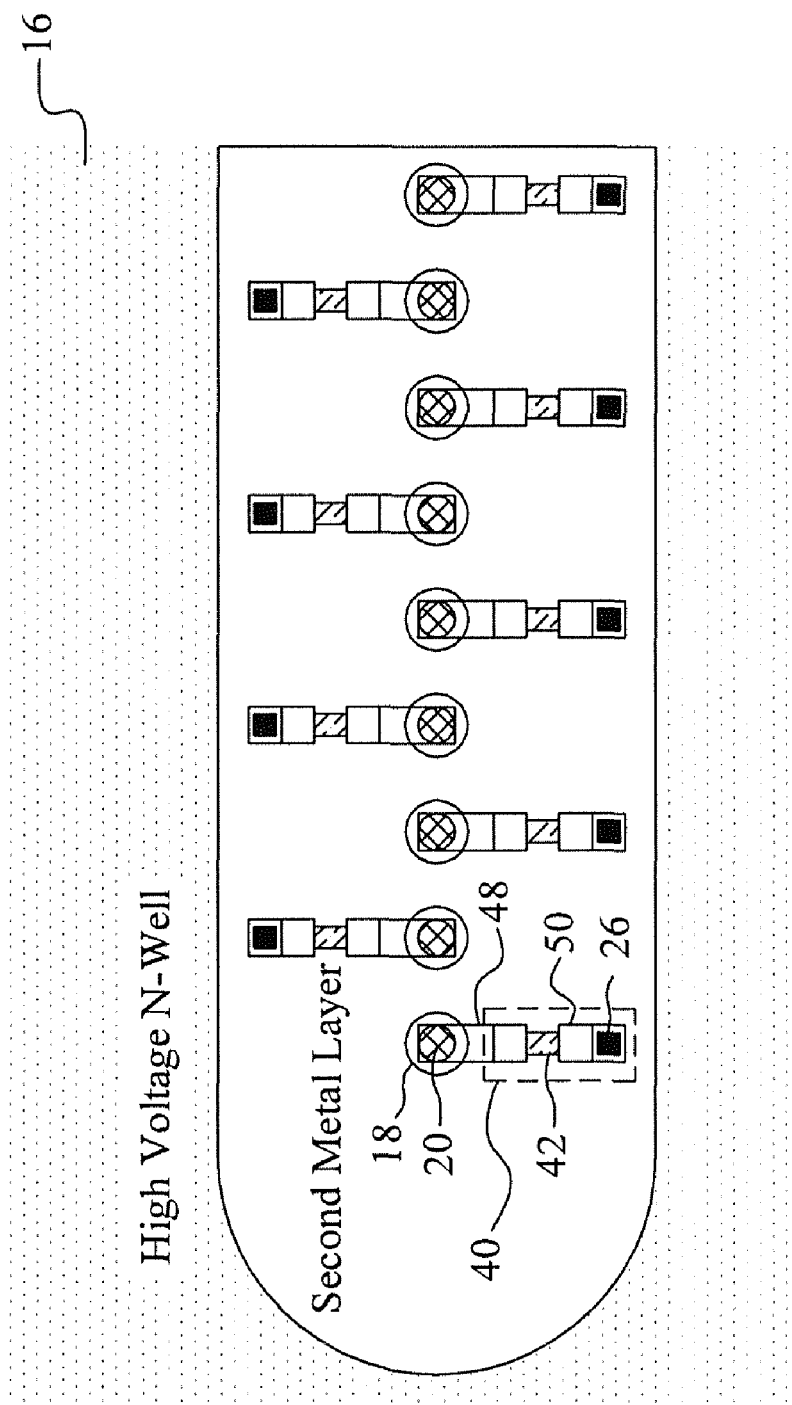
FIG. 6 is a horizontal layout of a third embodiment according to the present invention.

FIG. 6 provides a third embodiment as a combination of the above two embodiments, which distributes the contact region 18 to the distributed contact plug 20, thereby forming a plurality of discrete islands, in addition to connect each contact plug 20 with a fuse apparatus 40 as that shown in FIG. 5.

As illustrated by the above embodiments, the present invention effectively improves the ESD performance of an ultra-high voltage device to an acceptable level without changing the dimension, IV characteristics and manufacturing process of the Ultra-high voltage device.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A structure in a high voltage path of an ultra-high voltage device for providing ESD protection, the high voltage path being established from a high voltage N-well through a first metal layer to a second metal layer, the structure comprising:
   a contact plug connected between the high voltage N-well and the first metal layer, having a distributed structure on a horizontal layout of the ultra-high voltage device; and
   a contact region on the high voltage N-well, being electrically contacted by the contact plug, and conforming to the contact plug so as to form a dot-like distribution of discrete islands on the horizontal layout.

2. A structure in a high voltage path of an ultra-high voltage device for providing ESD protection, the high voltage path being established from a high voltage N-well through a first metal layer to a second metal layer, the structure comprising:
   a continuous contact region on the high voltage N-well;
   a contact plug having a distributed structure on a horizontal layout of the ultra-high voltage device, electrically contacting the contact region and electrically connecting to the first metal layer; and
   a plurality of fuse apparatus, each individually connected to the first metal layer;
   wherein each of the fuse apparatus includes:
      a first portion and a second portion being provided by the first metal layer and separate from each other, the first portion connected to the contact plug, the second portion connected to the second metal layer through a via;
      a first connection and a second connection connected to the first portion and the second portion of the first metal layer, respectively; and
      a poly fuse connected to the first and second connections.

3. A structure in a high voltage path of an ultra-high voltage device for providing ESD protection, the high voltage path being established from a high voltage N-well through a first metal layer to a second metal layer, the structure comprising:
   a contact plug connected between the high voltage N-well and the first metal layer, having a distributed structure on a horizontal layout of the ultra-high voltage device; and
   a contact region on the high voltage N-well, being electrically contacted by the contact plug, and conforming to the contact plug so as to form a dot-like distribution of discrete islands on the horizontal layout; and
   a plurality of fuse apparatus, each individually connected to the first metal layer;
   wherein each of the fuse apparatus includes:
      a first portion and a second portion being provided by the first metal layer and separate from each other, the first portion connected to the contact plug, the second portion connected to the second metal layer through a via;
      a first connection and a second connection connected to the first portion and the second portion of the first metal layer, respectively; and
      a poly fuse connected to the first and second connections.

* * * * *